United States Patent [19]
Caldera et al.

[11] Patent Number: 5,841,968
[45] Date of Patent: Nov. 24, 1998

[54] PROCESSOR CIRCUIT WITH TESTING DEVICE

[75] Inventors: Peter Caldera, Villach; Markus Steiner, St. Ulrich, both of Austria

[73] Assignee: Siemens Akiengesellschaft, Munich, Germany

[21] Appl. No.: 871,677

[22] Filed: Jun. 6, 1997

Related U.S. Application Data

[63] Continuation of Ser. No. 297,984, Aug. 30, 1994, abandoned.

[30] Foreign Application Priority Data

Aug. 30, 1993 [DE] Germany .................... 43 29 150.3

[51] Int. Cl.⁶ .................................................. G06F 11/00
[52] U.S. Cl. .............................. 395/183.06; 395/183.16
[58] Field of Search .............................. 395/575, 183.06, 395/183.01, 183.16; 371/22.5, 226, 25.1, 16.1, 16.4, 22.1, 22.2, 22.35, 24, 21.2, 48, 67.1, 71, 21.1

[56] References Cited

U.S. PATENT DOCUMENTS

| | | | |
|---|---|---|---|
| 4,433,413 | 2/1984 | Fasang | 371/22.4 |
| 4,541,094 | 9/1985 | Stiffler et al. | 395/185.06 |
| 4,546,473 | 10/1985 | Eichelberger et al. | 371/25.1 |
| 5,157,781 | 10/1992 | Harwood et al. | 395/183.06 |
| 5,258,985 | 11/1993 | Spence et al. | 371/22.4 |
| 5,416,783 | 5/1995 | Broseghini et al. | 371/22.33 |

FOREIGN PATENT DOCUMENTS 0523438  1/1993  European Pat. Off. .

OTHER PUBLICATIONS

A Tutorial on Built–In–Self–Test, Part 1: Principles, (Agrawal et al.), dated Mar. 10, 1993, pp. 73–82.

Realization of an Efficient Design Verification Test Based on a Microinstruction Controlled Self–Test, Proceedings of the International Test Conference, Washington, (Yasuyuki Nozuyama), dated Sep. 10–14, 1990, No. 1, Conf. 21, Institute of electrical and electronics engineers, dated Sep. 10, 1990, pp. 327–336.

Self–Test of Processor–chips, (Ritter et al.), dated Mar. 30, 1990, Elekronik, pp. 38–40, vol. 39, No. 7 (Not in English).

*Primary Examiner*—Trinh L. Tu
*Attorney, Agent, or Firm*—Herbert L. Lerner; Laurence A. Greenberg

[57] ABSTRACT

A processor circuit configuration with a control processor and circuit blocks which are connected to the control processor through a bus. A testing device includes test decoders which are each assigned to a respective one of the circuit blocks. The test decoders receive control signals from the control processor and from a test logic, which is also connected to the bus, for controlling the circuit blocks. In a test mode, the test logic selects a given circuit block, deactivates all other circuit blocks, transmits test data through the bus to the given circuit block, activates the control processor, receives test data sent through the bus from the given circuit: block, evaluates the test data, and issues a corresponding result signal. The processing of the test data in the given circuit block is determined by the control processor.

3 Claims, 1 Drawing Sheet

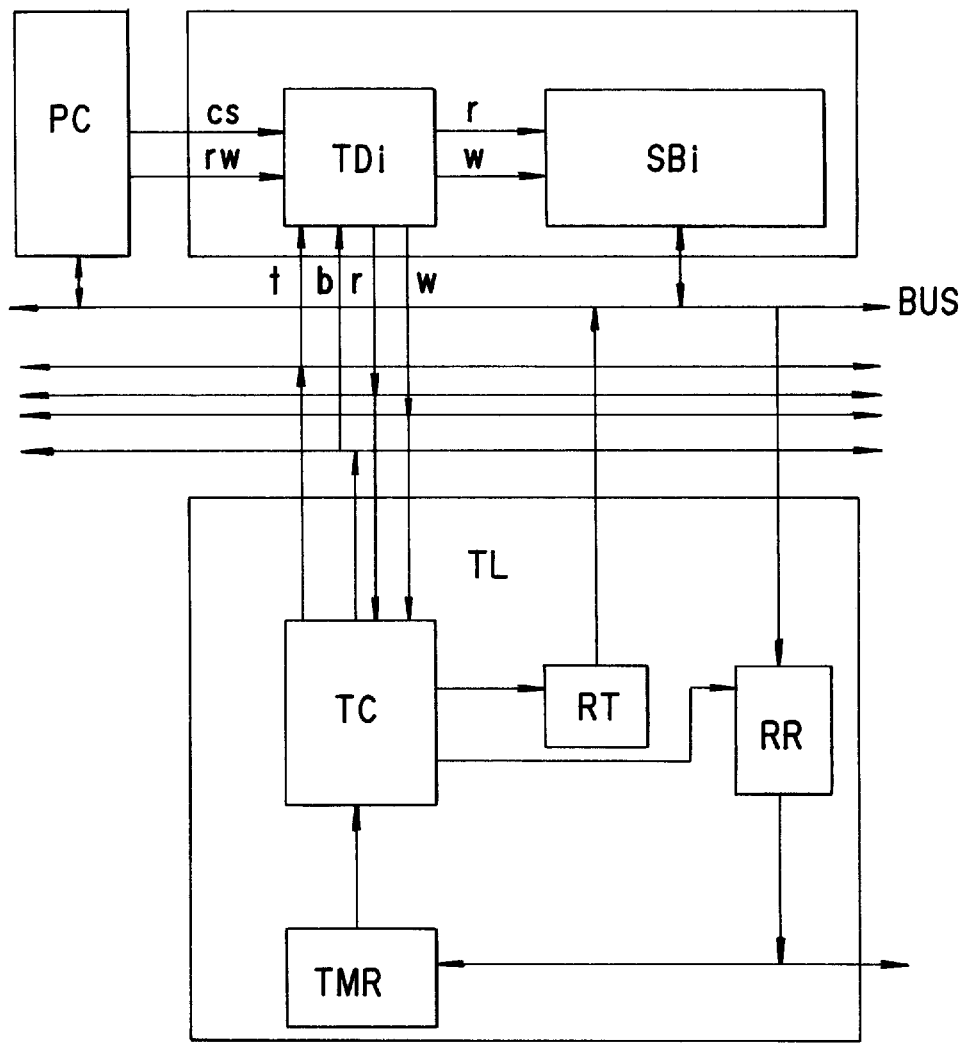

PROCESSOR CIRCUIT WITH TESTING DEVICE

CROSS-REFERENCE TO RELATED APPLICATION

This application is a continuation of U.S. application Ser. No. 08/297,984, filed on Aug. 30, 1994, now abandoned.

BACKGROUND OF THE INVENTION

FIELD OF THE INVENTION

The invention relates to a processor circuit with a control processor, with at least one circuit block connected thereto through a bus, and with a testing device.

With each new development, the packing density of transistors and other components grows in integrated circuits in general, and particularly in processor circuits such as microprocessors, signal processors, and microcontrollers. The expense with regard to the development of test programs and the preparation of test procedures has already reached a level which is comparable to the actual development cost. Furthermore, the continuous increase in the functionality leads to a logical depth which moves the goal of completely detecting faults further and further away.

SUMMARY OF THE INVENTION

It is accordingly an object of the invention to provide a processor circuit with a testing device, which overcomes the hereinafore-mentioned disadvantages of the heretofore-known devices of this general type and which defines a processor circuit which can be efficiently and economically tested.

With the foregoing and other objects in view there is provided, in accordance with the invention, a processor circuit configuration, comprising:
- a control processor, a bus connected to the control processor, and at least one circuit block connected to the control processor through the bus;
- a testing device connected to the control processor, to the bus and to the at least one circuit block, the testing device including:
  - at least one test decoder connected to the at least one circuit block; and
  - a test logic connected to the test decoder and to the bus;
- the at least one test decoder receiving control signals from the test logic and from the control processor, and controlling the at least one circuit block;
- the test logic having means for switching to a test mode operation, for issuing control signals and for selecting a given circuit block from the at least one circuit block, means for deactivating all circuit blocks other than the given circuit block, means for transmitting test data to the selected circuit block through the bus, means for activating the control processor, means for receiving from the bus test data transmitted by the given circuit block, means for evaluating the test data and for issuing a corresponding result signal; and
- the control processor controlling processing of the test data in the given circuit block.

In other words, the above-noted problems are overcome in a processor circuit of the kind described above by means of a testing device in which a test decoder is assigned to each circuit block which receives control signals from a test logic (also connected to the bus) and from the sequential control processor, which subsequently controls the respective circuit block, and in which, when the circuit is in the testing mode, the test logic selects a selected circuit block by means of the control signals, deactivates all other circuit blocks, transmits test data to the respective circuit block through the bus, activates the control processor, receives modified test data from the selected circuit block through the bus, evaluates these data, and issues a corresponding result signal; processing of the test data here is determined in the selected circuit block by the sequential control processor.

The invention makes it possible to test digital components with an integrated processor core in accordance with the conventional methods for built-in self-tests (BIST). The proposed modular concept has decisive spatial advantages. In contrast with BIST concepts assigned to local circuit blocks, i.e. the circuit blocks to be tested, data are processed and compressed only once centrally. Furthermore, the sequential control processor as well as, in particular, the microcode of the processor are used in the test itself. Therefore, no special actuation control and no special test microprogram for the circuit blocks to be tested is necessary. Since the selected circuit blocks will always run through the entire microprogram with all instructions necessary for the normal mode operation, sufficient test coverage is guaranteed. An additional advantage is the fact that the bus connecting all circuit blocks is also tested in the process.

In accordance with another feature of the invention, the various means of the test logic are embodied in a test control unit providing initialization, test sequence control, and evaluation, a test mode register storing an address corresponding to the given circuit block, at least one test data transmission register storing the test data for the given circuit block, and at least one test data receiving register into which the test data modified by the given circuit block are entered for evaluation by the test control unit.

In accordance with a concomitant feature of the invention, the test data receiving register is formed of a shift register with feedback through EXOR linkages and having a plurality of inputs, and means for compressing the test data modified by the given circuit block through modulo-2 additions with a given polynomial.

Again in other words, an embodiment of the invention provides for a test logic which has one test control unit providing the initialization, sequential test control, and test evaluation, one test mode register storing an address corresponding to the selected circuit block, a test data transmission register storing the test data destined for the selected circuit block, and a test data receiving register in which the test data transmitted by the selected circuit block are entered for evaluation by the test control unit. Here, the test data receiving register is preferably in the form of a shift register with feedback through EXOR linkages with several inputs compressing the received test data into a signature by means of modulo-2 additions with a polynomial, in a manner which is known to the art.

Other features which are considered as characteristic for the invention are set forth in the appended claims.

Although the invention is illustrated and described herein as embodied in a processor circuit with a testing device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the single FIGURE of the drawing.

BRIEF DESCRIPTION OF THE DRAWINGS

The FIGURE is a diagrammatic illustation of an embodiment of the circuit configuration according to the invention.

DESCRIPTION OF THE PREFERRED EMBODIMENTS

Referring now to the only FIGURE of the drawing in detail, the processor circuit configuration illustrated by way of example includes a sequential control processor PC and several circuit blocks SB which are connected through a bus BUS. Only a single circuit block SBi is illustrated. The circuit blocks referred to herein are, for example, arithmetic and logic units (ALU), read-only memories (ROM), read/write memories such as a random access memory (RAM), input/output modules (IOM), and the like.

In addition, for the purpose of a self-test, a testing device is proposed which comprises a central test logic TL and local test decoders TD. The drawing again shows only one test decoder, namely the ith test decoder TDi assigned to the circuit block SBi. All circuit blocks SB are linked to the test logic TL through the bus BUS as well as through control lines by the intermediary of the respective test decoders TD.

The test logic TL transmits a signal t to the respective test decoder TDi, which differentiates between normal mode and test mode, and a signal b which selects the respective test decoder TDi. Signals r and w, which show whether data are written into the circuit block SBi or are read out therefrom, are transmitted from the test decoder TDi to the test logic TL. The signals r and w are also present at the circuit block SBi.

The fact whether data are to be written into the circuit block SBi or read out from it, depends on a block selection signal cs and a write-read signal rw generated by the control processor PC in accordance with the sequences defined in its microprogram.

The test logic TL preferably comprises a test controller TC, a test mode register TMR, a test data transmission register RT, and a test data receiving register RR. The test controller TC contains the control of the test sequence, i.e. initialization, test monitoring, and test data evaluation. The circuit block to be tested, in accordingly coded form, and possibly additional coded data concerning the transmission mode of the test data transmission register RT are programmed in the test mode register TMR. The test mode register TMR in turn supplies the circuit block or blocks to be tested with the test stimuli. Finally, data transmitted by the circuit block SBI are stored in the test data receiving register RR. The test data receiving register RR preferably consists of a known multiple input shift register (MISR) which compresses the test responses received from the individual circuit blocks and stored therein into a signature by means of modulo-2 additions.

The test sequence is started by writing into the test mode register TMR. The content of the test mode register TMR determines which circuit block SBi is to be tested and the manner of test data transmission. Simultaneously with writing, the test control unit TC is activated and then signals the test mode activation to the selected circuit block SBi. This prevents all other circuit blocks from accessing a bus, particularly from accessing a data bus. The control lines for the circuit block SBi, for example a write/read memory (RAM), are controlled, as during normal operation, by the processor core PC under control of its microprogram. The processor core PC here generates, based on its microprogram, the block selection signal cs and a write or read signal rw in the conventional manner. From these signals, the write control signal w or the read control signal r are derived by the respective test decoder TDi and transmitted to the circuit block SBi as well as the test control unit TC. This indicates to both the direction of the data flow. In contrast to normal mode operation, the data are now not transmitted to another circuit block, e.g. the arithmetic unit, via the data bus, but rather data are made available by the test logic TL and transmitted to the circuit block SBi and the data which are, for example, unchanged, modified, or newly generated by the circuit block SBi, are transmitted back to the test logic TL by the circuit block SBi and subsequently evaluated by the test logic TL. The control of the test data transmission register RT and the test data receiver register RR are controlled by the test control unit TC on the basis of the signals r and w. After a certain number of access instances, the test control device TC terminates the test and the result (signature) can be read out through a suitable interface, e.g. a port or a microcontroller.

We claim:

1. Processor circuit configuration, comprising:

a control processor, a bus connected to said control processor, and a plurality of circuit blocks connected to said control processor through said bus;

a testing device connected to said control processor, to said bus and to said circuit blocks, said testing device including:

a plurality of test decoders each connected to a respective one of said circuit blocks; and a test logic connected to each of said test decoders and to said bus;

said test decoders receiving control signals from said test logic and from said control processor, and controlling the respective said circuit block, said test logic switching to a test mode operation, issuing control signals and selecting a given circuit block from said plurality of circuit blocks, said test logic deactivating all circuit blocks other than said given circuit block, transmitting test data to said selected circuit block through said bus, activating said control processor, receiving from said bus test data transmitted by said given circuit block, evaluating the test data and issuing a corresponding result signal; and said control processor controlling processing of the test data in said given circuit block.

2. The processor circuit configuration according to claim 1, wherein said test logic includes a test control unit providing initialization, test sequence control, and evaluation, a test mode register storing an address corresponding to said given circuit block, at least one test data transmission register storing the test data for said given circuit block, and at least one test data receiving register into which the test data modified by said given circuit block are entered for evaluation by said test control unit.

3. The processor circuit configuration according to claim 2, wherein said test data receiving register is formed of a shift register with feedback through EXOR linkages and having a plurality of inputs, and means for compressing the test data modified by said given circuit block through modulo-2 additions with a given polynomial.

* * * * *